(12) United States Patent
Leidy et al.

(10) Patent No.: US 9,915,720 B2
(45) Date of Patent: Mar. 13, 2018

(54) APPARATUS AND METHODS FOR FIELD TESTING AN ELECTRICAL PANEL METER SYSTEM

(71) Applicant: Siemens Industry, Inc., Alpharetta, GA (US)

(72) Inventors: Matthew Leidy, Norcross, GA (US); Kevin Miller, Duluth, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 256 days.

(21) Appl. No.: 14/840,376

(22) Filed: Aug. 31, 2015

(65) Prior Publication Data

US 2016/0259026 A1 Sep. 8, 2016

Related U.S. Application Data

(60) Provisional application No. 62/127,909, filed on Mar. 4, 2015.

(51) Int. Cl.
*G01R 35/04* (2006.01)
(52) U.S. Cl.
CPC .................... *G01R 35/04* (2013.01)
(58) Field of Classification Search
CPC ...................................................... G01R 35/04
USPC ........................................................... 324/74
See application file for complete search history.

(56) References Cited

U.S. PATENT DOCUMENTS

| 5,650,717 A | 7/1997 | Draus |
| 6,112,158 A * | 8/2000 | Bond ................. G01R 21/1333 324/107 |
| 2003/0151415 A1* | 8/2003 | Randall .................. G01R 35/04 324/601 |
| 2009/0153145 A1* | 6/2009 | Engel ..................... G01R 35/02 324/537 |
| 2011/0221600 A1 | 9/2011 | Kinsel |

OTHER PUBLICATIONS

European Search Report dated Sep. 9, 2016 corresponding to European Application 16158137.6 filed Mar. 1, 2016 (10 pages).

* cited by examiner

*Primary Examiner* — Melissa Koval
*Assistant Examiner* — Courtney McDonnough (57) ABSTRACT

An electrical panel meter system may include a plurality of meter modules housed in an electrical panel enclosure. Each meter module may be configured to sample electrical readings related to electrical power provided to a respective branch circuit of the electrical panel meter system. To field test the metering accuracy of each meter module, a field tester may be coupled to the electrical panel enclosure. The field tester may inject an electrical signal via a test conductor provided in the electrical panel enclosure. The test conductor may be coupled to each meter module. The field tester may measure an electrical parameter of the injected electrical signal and compare it to electrical readings sampled by the meter modules. A pass/fail result for each meter module may be indicated. Methods of field testing meter modules in an electrical panel meter system are also provided, as are other aspects.

20 Claims, 4 Drawing Sheets

APPARATUS AND METHODS FOR FIELD TESTING AN ELECTRICAL PANEL METER SYSTEM

RELATED APPLICATION

This claims the benefit of U.S. Provisional Patent Application No. 62/127,909, filed Mar. 4, 2015 and titled "SEM3 Field Tester," the disclosure of which is hereby incorporated by reference herein in its entirety for all purposes.

FIELD

The invention relates generally to an electrical panel meter system that can monitor a plurality of branch circuits and, more particularly, to a field tester that can test the metering accuracy of the electrical panel meter system.

BACKGROUND

Commercial and/or industrial electrical panel meter systems may provide electrical power and circuit-breaker protection to a plurality of electrical branch circuits via an electrical panel coupled to a power source. Commercial and/or industrial electrical panel meter systems may have, e.g., 40-50 branch circuits. Each branch circuit may have its own meter module mounted in the electrical panel that may provide electrical readings at periodic intervals as determined by a controller of the electrical panel meter system. The electrical readings may include one or more of, e.g., power (kilowatts), energy (kilowatt-hours), voltage (volts), current (amps) and/or related parameters (e.g., power factor) and combinations thereof. In some known electrical panel meter systems, testing the metering accuracy of the meter modules may involve removing the meter modules from the electrical panel meter system and individually testing each with specialized, often non-portable, test equipment. Such testing may be tedious, time consuming, and/or costly.

Accordingly, there is a need for apparatus and methods for field testing the metering accuracy of meter modules in an electrical panel meter system.

SUMMARY

According to one aspect, a field tester for testing metering accuracy is provided. The field tester includes a reference power meter; a current source having an output coupled to an input of the reference power meter; a computer coupled to the reference power meter and to the current source, the computer comprising a processor and a memory; a plurality of power conductors coupled to the reference power meter and to the current source and configured to be coupled to a respective plurality of terminals of a main line connector of an electrical panel meter system; a first conductor coupled to an output of the reference power meter and configured to be coupled to a first terminal of a test conductor of the electrical panel meter system, the test conductor coupled sequentially to each meter module of the electrical panel system; a second conductor coupled to a return of the current source and configured to be coupled to a second terminal of the test conductor; and a third conductor coupled to the computer and configured to be coupled to a controller of the electrical panel meter system.

According to another aspect, an electrical panel meter system configured to be field tested for metering accuracy is provided. The electrical panel meter system includes a plurality of branch circuit connectors, each one of the plurality of branch circuit connectors configured to be coupled to a respective branch circuit to provide electrical power thereto; a plurality of current sensors, each one of the plurality of current sensors coupled to a respective one of the plurality of branch circuit connectors; a plurality of meter modules, each one of the plurality of meter modules coupled to a respective one of the plurality of current sensors; a controller coupled to the plurality of meter modules; a test conductor coupled sequentially to each one of the plurality of current sensors, the test conductor having no electrical connection to the plurality of branch circuit connectors; a first terminal coupled to one end of the test conductor; and a second terminal coupled to a second opposite end of the test conductor.

According to a further aspect, a method of field testing an electrical panel meter system for metering accuracy is provided. The method includes coupling a plurality of conductors from a field tester to the electrical panel meter system; injecting an electrical signal from the field tester into the electrical panel meter system; measuring at the field tester a parameter of the electrical signal; receiving an electrical reading from each of at least some of a plurality of meter modules of the electrical panel meter system; comparing each received electrical reading to the measured parameter; and indicating a pass/fail result for each of the at least some of the plurality of meter modules.

Still other aspects, features, and advantages of the invention may be readily apparent from the following detailed description wherein a number of example embodiments and implementations are described and illustrated, including the best mode contemplated for carrying out the invention. The invention may also include other and different embodiments, and its several details may be modified in various respects, all without departing from the scope of the invention. Accordingly, the drawings and descriptions are to be regarded as illustrative in nature, and not as restrictive. The invention covers all modifications, equivalents, and alternatives of the aspects disclosed herein.

BRIEF DESCRIPTION OF DRAWINGS

Persons skilled in the art will understand that the drawings, described below, are for illustrative purposes only. The drawings are not necessarily drawn to scale and are not intended to limit the scope of this disclosure in any way.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts.

The aforementioned deficiencies of some commercial and/or industrial electrical panel meter systems may be overcome by one or more embodiments of the invention. In one aspect, a field tester for testing metering accuracy may include a computer, a current source, and a reference power meter. The field tester may be portable and, in some embodiments, may be about the size of a briefcase or small suitcase. The field tester may be configured to be coupled to an electrical panel meter system, which may include a controller and a plurality of meter modules to be tested. The meter modules may be tested in place within an electrical panel enclosure of the electrical panel meter system. Each meter module may be configured to sample and store real-time electrical readings related to electrical power provided to a respective branch circuit of the electrical panel meter system. The electrical panel meter system may have a test conductor coupled to each of the meter modules. The test conductor may have terminals to which the field tester can be coupled. The test conductor may not be electrically coupled to any of the branch circuits.

To test the metering accuracy of each of the meter modules, branch circuit breakers of the electrical panel meter system may be opened (i.e., power to the branch circuits may be disconnected). The field tester may be coupled to a main line connector of the electrical panel meter system to receive power. The computer of the field tester may be coupled to and communicate with the controller of the electrical panel meter system. The computer may cause an electrical signal of known voltage and current provided by the current source of the field tester to be injected into the test conductor. The reference power meter of the field tester may measure a parameter of the electrical signal, such as, e.g., energy (measured in, e.g., kilowatt-hours). The measured parameter may be stored in a memory of the computer of the field tester. The computer may instruct the controller to poll and transfer to the field tester electrical readings sampled by the meter modules. The electrical readings provided by the meter modules include at least the same parameter as measured by the reference power meter. The computer may compare the received electrical readings with the measured parameter and, based on a predetermined margin of allowable error, indicate a pass/fail result for each tested meter module. In some embodiments, the pass/fail results may be shown on a display of the computer. The pass/fail results may additionally or alternatively be downloaded from the field tester to a host computer or other computer device, printed at a printer coupled to the field tester, and/or otherwise provided to a user in any suitable manner. In some embodiments, testing of about 40-50 meter modules may be completed in about 20-60 seconds.

In other aspects, methods of field testing an electrical panel meter system for metering accuracy are provided, as will be explained in greater detail below in connection with FIGS. 1-5.

Figure 1:
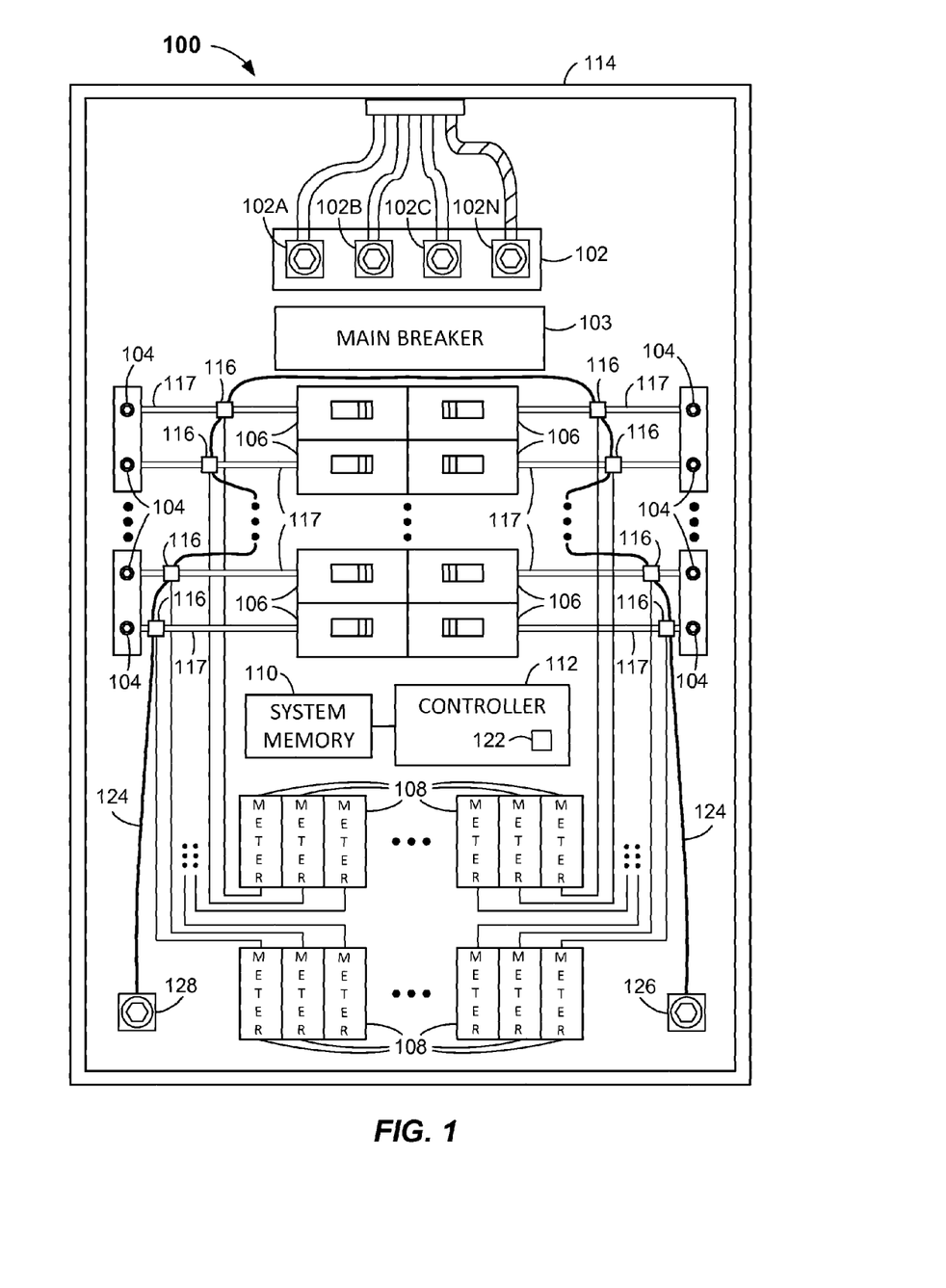
FIG. 1 illustrates a block diagram of an electrical panel meter system according to embodiments.

FIG. 1 illustrates an electrical panel meter system 100 in accordance with one or more embodiments. Electrical panel meter system 100 may include a main line connector 102, a plurality of branch circuit connectors 104, a plurality of circuit breakers 106, a plurality of meter modules 108, a system memory 110, and a controller 112. Electrical panel meter system 100 may also include an electrical panel enclosure 114 configured to house main line connector 102, the plurality of branch circuit connectors 104, the plurality of circuit breakers 106, the plurality of meter modules 108, system memory 110, and controller 112. In some embodiments, electrical panel meter system 100 may be an integrated electrical circuit panel that includes an SEM3™ Embedded Micro Metering Module™ by Siemens Industry, Inc., of Norcross, Ga., USA.

Main line connector 102 may be configured to couple to a source of power and may have three terminals 102A, 102B, and 102C for coupling to respective power phases (e.g., A, B, and C) of the source of power. Main line connector 102 may also have a neutral terminal 102N for coupling to a system neutral conductor. Each of terminals 102A, 102B, 102C and 102N may be coupled to respective power or neutral bus bars (not shown) within electrical panel enclosure 114, which in turn may be coupled to circuit breakers 106. The source of power may be an AC power system providing a line-to-line voltage of up to about 480 volts AC and a line-to-neutral voltage of less than 277 volts AC. Other embodiments may be configured to receive other ranges of voltages.

Branch circuit connectors 104 may each be configured to be coupled to a branch circuit of electrical panel meter system 100. Each branch circuit may receive power and circuit-breaker protection from electrical panel meter system 100. Each circuit breaker 106 may be coupled between main line connector 102 (via a power and neutral bus bar) and a respective branch circuit connector 104 via an electrical branch circuit conductor 117. In some embodiments, circuit breakers 106 may be rated from 50 amps to 1200 amps and may be single pole, double pole, or 3-pole. Other suitable types of circuit breakers 106 may be used in electrical panel meter system 100. In some embodiments, electrical panel meter system 100 may have 40-50 branch circuit connectors 104 and corresponding circuit breakers 106. Other embodiments may have more or less branch circuit connectors 104 and circuit breakers 106.

Figure 2:
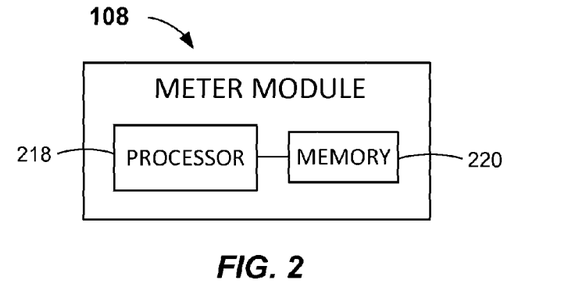
FIG. 2 illustrates a block diagram of a meter module according to embodiments.

Each meter module 108 may be coupled to a respective branch circuit connector 104 to measure and/or sample current, voltage, and/or other energy related parameters on a respective branch circuit. In some embodiments, one or more meter modules 108 may include and/or be coupled to a respective current sensor 116, which may be coupled to an electrical branch circuit conductor 117 coupled to a respective branch circuit connector 104. Current sensors 116 may each be used to measure current flowing through a respective branch circuit conductor 117. In some embodiments, one or more current sensors 116 may be a solid core or split core current transformer. Each meter module 108 may include a processor 218 and a memory 220, as shown in FIG. 2. Each meter module 108 may be configured to process current and/or voltage measurements or samplings in processor 218 via one or more algorithms stored in memory 220 to determine one or more electrical parameters, such as, e.g., energy, apparent power, real power, reactive power, total power, power factor, maximum current, maximum voltage, percent load, and/or peak power demand for the branch circuit coupled to the respective branch circuit connector 104. Other computer instructions capable of being executed by processor 218 may be stored in memory 220. In some embodiments, one or more meter modules 108 may additionally or alternatively include one or more voltage sensors and/or other types of current sensors. In some embodiments, each meter module 108 may be configured as a Modbus RTP (Remote Terminal Unit) supporting a Modbus TCP/IP (Transmission Control Protocol/Internet Protocol). Modbus is a serial communication protocol. Other suitable communication protocols may alternatively be used. In some embodiments, the number of meter modules 108 in electrical panel meter system 100 may correspond equally to the number of branch circuit connectors 104. In other embodiments, the number of meter modules 108 may be different than the number of branch circuit connectors 104.

System memory 110 may include one or more memory devices including, e.g., a dynamic random access memory (DRAM). Computer instructions capable of being executed by controller 112 may be stored in system memory 110. System memory 110 may be configured to store electrical readings sampled by meter modules 108 that represent electrical power provided to the branch circuits of electrical panel meter system 100. In some embodiments, system memory 110 may be configured to store in a separate area of system memory 110 electrical readings sampled by meter modules 108 while under test by a field tester in accordance with one or more embodiments, as described further below.

Controller 112 may be coupled to system memory 110 and to each meter module 108 via a communication infrastructure, which may include one or more communication buses (not shown in FIG. 1 for clarity). Controller 112 may include a connector 122 for communicating with other internal or external devices or components coupled thereto. Connector 122 may be an Ethernet connector or other suitable type of connector. In some embodiments, controller 112 may be configured to utilize, e.g., a Modbus TCP/IP for communicating with system memory 110, each meter module 108, and other internally and externally coupled devices or components. Controller 112 may provide a single Modbus slave address for the components in electrical panel meter system 100. Alternatively, other suitable communication protocols may be used, including any suitable master-slave/client-server communication infrastructure and protocol. Controller 112 may execute any suitable operating system and one or more applications stored in system memory 110 to provide energy monitoring, meter module testing, and related data calculation and analysis functions. In particular, controller 112 may perform various calculations and/or determinations related to the electrical readings received from meter modules 108. In some embodiments, controller 112 may communicate with meter modules 108 via Class 2 signals representing A, B, C, and N voltage levels for metering calculations.

Electrical panel meter system 100 may also include a test conductor 124 coupled sequentially in a loop to each current sensor 116 such that each current sensor 116 may sense a current flowing through test conductor 124. Test conductor 124 may not be electrically coupled to any one of branch circuit connectors 104 and/or electrical branch circuit conductors 117. That is, any electrical signal carried by test conductor 124 may not be electrically transmitted to any branch circuit coupled to a branch circuit connector 104. Test conductor 124 may have a first end coupled to a first terminal 126 and a second opposite end coupled to a second terminal 128. In some embodiments, test conductor 124 may be suitable for carrying current up to about 20 amps. In some embodiments, test conductor 124 may be suitable for carrying current of about 10-15% of the maximum current rated for meter modules 108.

Note that electrical panel meter system 100 may be configured in some embodiments to include software, hardware, and/or firmware components in addition to or different from those shown in FIGS. 1 and 2 and described herein.

Figure 3:
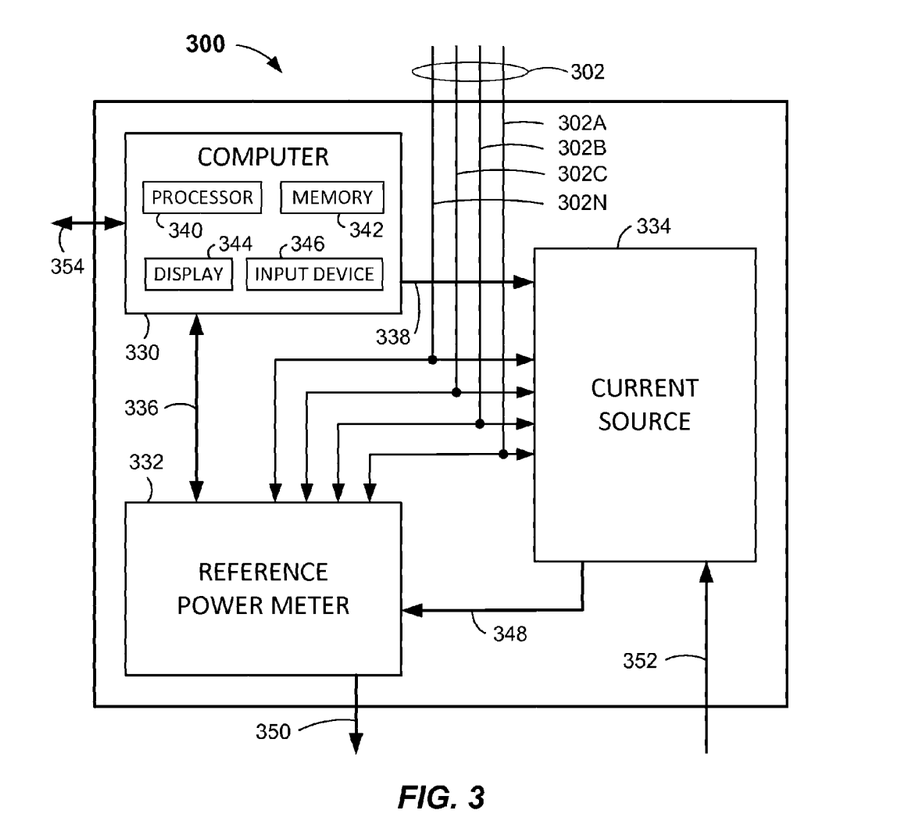
FIG. 3 illustrates a block diagram of a field tester according to embodiments.

FIG. 3 illustrates a field tester 300 in accordance with one or more embodiments. Field tester 300 may be configured to test an electrical panel meter system for metering accuracy, such as, e.g., meter modules 108 of electrical panel meter system 100. Field tester 300 may include a computer 330, a reference power meter 332, and a current source 334. Computer 330 may be coupled to and may communicate with reference power meter 332 via a conductor 336. Computer 330 may be coupled to and may control current source 334 via a conductor 338. Computer 330 may include a processor 340, a memory 342, a display 344, and an input device 346, which may be, e.g., a keyboard, a touchpad, and/or a cursor control device (e.g., a mouse). In some embodiments, computer 330 may be a laptop computer. In other embodiments, computer 330 may be any suitable computer device.

Reference power meter 332 may, in some embodiments, be a minimum of 10 times as accurate as the device under test (e.g., meter modules 108). Thus, for example, if meter modules 108 are rated at 0.2% error, reference power meter 332 may have an accuracy rating of, e.g., 0.02% or better. Reference power meter 332 may alternatively have other suitable accuracy ratings.

Current source 334 may have an output coupled to an input of reference power meter 332 via a conductor 348. In some embodiments, current source 334 may be configured to provide AC current of about 10-15% of the maximum rated current for meter modules 108. Current source 334 may also be configured to provide that level of current for about 20-60 seconds in some embodiments. Current source 334 may be configured to provide up to 20 amps AC in some embodiments. Other suitable amounts and durations of current may alternatively be provided by current source 334. Current source 334 may include one or more power resistors or, alternatively, may include an active device. In some embodiments, AC electrical signals generated by current source 334 may be synchronized with AC line voltage received by current source 334, which may result in a power factor of about one.

Field tester 300 may also include a plurality of power conductors 302, including an A phase conductor 302A, a B phase conductor 302B, a C phase conductor 302C, and a neutral conductor 302N in some embodiments. Power conductors 302A, 302B, 302C, and 302N may be coupled to reference power meter 332 and to current source 334 and may be configured to be coupled to terminals of a main line connector of an electrical panel meter system, such as, e.g., terminals 102A, 102B, 102C, and 102N of main line connector 102 of electrical panel meter system 100. In some embodiments, reference power meter 332 and current source 334 may be configured to receive line-to-line voltage of up to about 480 volts AC via power conductors 302. Other suitable line-to-line voltages may be received by reference power meter 332 and current source 334 in other embodiments.

Field tester 300 may further include a first conductor 350, a second conductor 352, and a third conductor 354. First conductor 350 may be coupled to an output of reference power meter 332 and may be configured to be coupled to, e.g., first terminal 126 of test conductor 124 of electrical panel meter system 100. Second conductor 352 may be coupled to a return of current source 334 and may be configured to be coupled to, e.g., second terminal 128 of test conductor 124. An electrical signal generated by current source 334 may be provided to an electrical panel meter system via first and second conductors 350 and 352. Third conductor 354 may be coupled to computer 330 and may be configured to be coupled to a controller of an electrical panel meter system, such as, e.g., controller 112 of electrical panel meter system 100.

Some embodiments of field tester 300 may include components in addition to or different from those shown in FIG. 3 or described herein.

Figure 4:
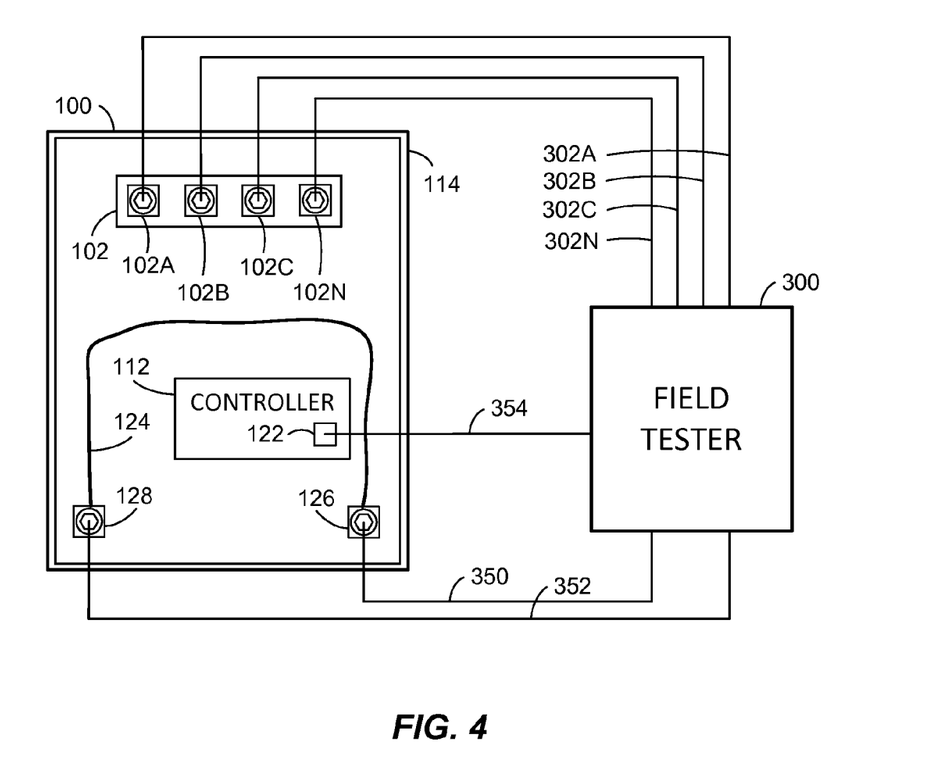
FIG. 4 illustrates a block diagram of a field tester coupled to an electrical panel meter system according to embodiments.

To field test an electrical panel meter system, such as, e.g., electrical panel meter system 100, field tester 300 may be coupled to electrical panel meter system 100 as shown in FIG. 4 (note that only main line connector 102, controller 112, test conductor 124, and terminals 126 and 128 of electrical panel meter system 100 are shown in FIG. 4 for clarity). Branch circuit breakers 106, and in some embodiments, main breaker 103, may be opened before coupling field tester 300 to electrical panel meter system 100. Power conductors 302A, 302B, 302C, and 302N of field tester 300 may be respectively coupled to terminals 102A, 102B, 102C, and 102N of main line connector 102 of electrical panel meter system 100 to provide power to current source 334. Note that computer 330 and reference power meter 332 may derive their operating power from the power provided by power conductors 302A, 302B, 302C, and 302N. First and second conductors 350 and 352 of field tester 300 may be respectively coupled to terminals 126 and 128 of test conductor 124 to provide an electrical signal to test conductor 124 for testing the metering accuracy of meter modules 108. Third conductor 354 of field tester 300 may be coupled to connector 122 of controller 112 of electrical panel meter system 100 to establish communication between controller 112 and computer 330 of field tester 300. In some embodiments, connector 122 may be an Ethernet connector and conductor 354 may provide Ethernet communications between controller 112 and computer 330. Other types of connectors and communications between controller 112 and computer 330 may alternatively be used.

After coupling field tester 300 to electrical panel meter system 100, a user may initiate a metering accuracy test via an appropriate input at computer 330. In some embodiments, computer 330 may be configured to perform the following: issue a test mode command to controller 112, command current source 334 to output an electrical signal via first conductor 350, command reference power meter 332 to measure a parameter related to the electrical signal, and issue a send command to controller 112 to have at least some of the plurality of meter modules sample electrical readings of the electrical signal passing through test conductor 124 and to send the sampled electrical readings back to computer 330. In some embodiments, computer 330 may also be configured to perform the following: receive the sampled electrical readings, compare the received electrical readings to a parameter of the electrical signal measured by reference power meter 332, and indicate a pass/fail result for each of the at least some of meter modules 108 (e.g., in some embodiments, only those meter modules 108 coupled to a branch circuit of a particular power phase A, B, or C may be tested at the same time).

In some embodiments, controller 112 of electrical panel meter system 100 may be configured to receive a test mode command from field tester 300, wherein controller 112 may respond by putting electrical panel meter system 100 into a test mode and by sending diagnostic information (e.g., serial number, firmware version, breaker ratings, and phase selected for testing) to field tester 300. Controller 112 may also be configured to issue a read command to at least some of meter modules 108 in response to receiving a send command from field tester 300. Each meter module 108 may be configured to sample an electrical reading in response to receiving a read command from controller 112, and to transfer a sampled electrical reading to controller 112. Controller 112 may further be configured to receive electrical readings from the at least some of the meter modules 108 in response to issuing the read command, and to send the received electrical readings to field tester 300. In some embodiments, the test mode electrical readings may be stored in system memory 110.

Figure 5:
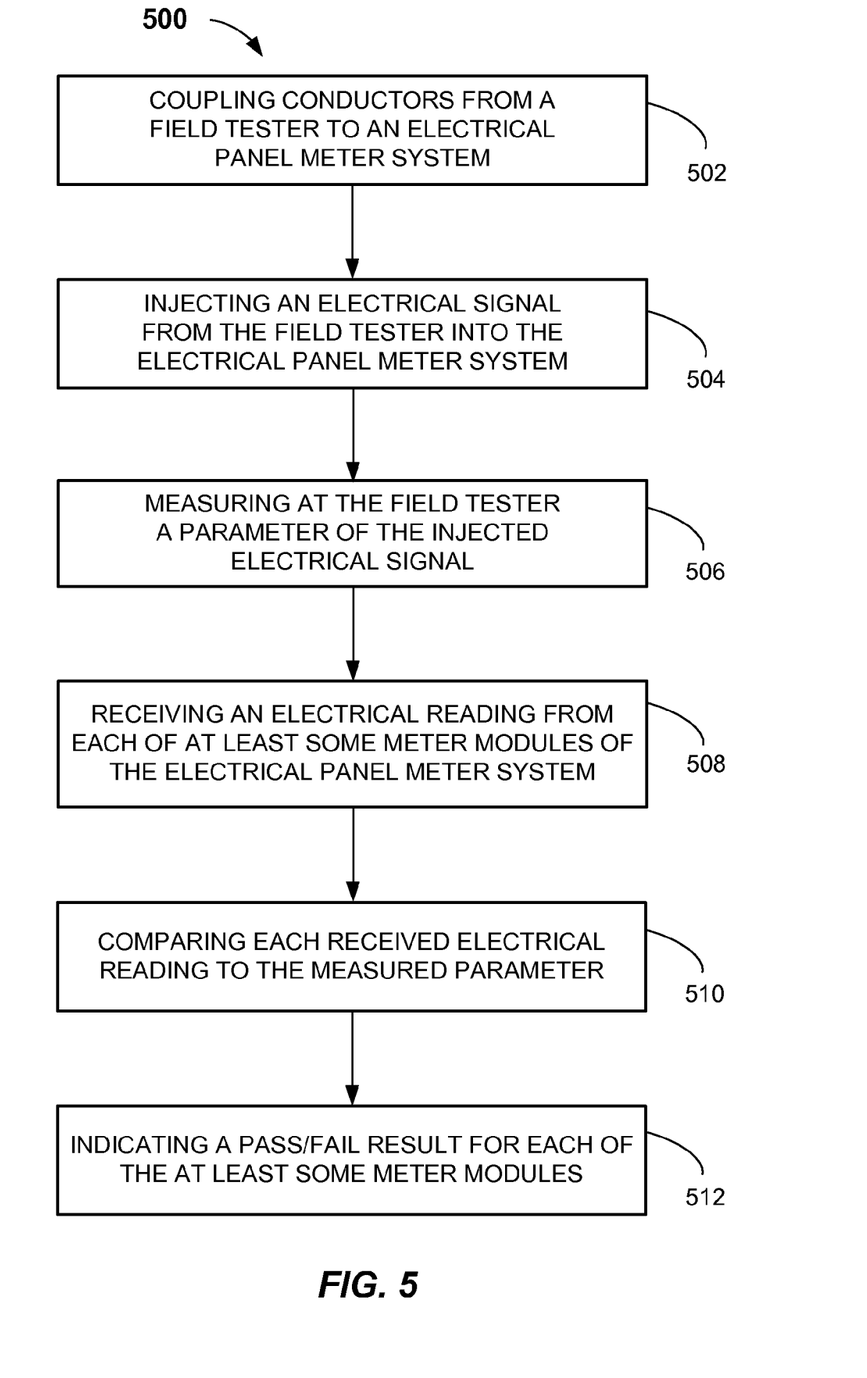
FIG. 5 illustrates a flowchart of a method of field testing an electrical panel meter system for metering accuracy according to embodiments.

FIG. 5 illustrates a flowchart of a method 500 of field testing an electrical panel meter system for metering accuracy in accordance with one or more embodiments. Method 500 may include at process block 502 coupling a plurality of conductors from a field tester to the electrical panel meter system. As shown and described above in connection with FIG. 4, field tester 300 may be coupled to electrical panel meter system 100 via conductors 302A, 302B, 302C, 302N, 350, 352, and 354.

At process block 504, method 500 may include injecting an electrical signal from the field tester into the electrical panel meter system. The injected electrical signal may be an AC signal generated and output by current source 334 of field tester 300 and may be of known voltage and current. In some embodiments, the electrical signal may be synchronized to a power phase-to-neutral voltage, such as, e.g., in a three-phase system, an A-N voltage, a B-N voltage, or a C-N voltage. Referring to FIGS. 3 and 4, the electrical signal may be injected into first terminal 126 of electrical panel meter system 100 via first conductor 350.

At process block 506, method 500 may include measuring at the field tester a parameter of the electrical signal. Referring to FIG. 3, computer 330 may command reference power meter 332 to measure a parameter of the electrical signal generated by current source 334. As shown in FIG. 3, conductor 348 couples an output of current source 334 to an input of reference power meter 332. The measured parameter may be a value of power, energy (power per unit of time), voltage, current, and/or combinations thereof. The value of the measured parameter may be stored in memory 342 of computer 330 of field tester 300.

At process block 508, method 500 may include receiving an electrical reading from each of at least some of a plurality of meter modules of the electrical panel meter system. For example, referring to FIGS. 2, 3, and 4, field tester 300 may receive an electrical reading from each of at least some meter modules 108 via conductor 354. The electrical reading may be, or may include, the same parameter as measured by reference power meter 332. The meter modules 108 that provide electrical readings may each be coupled to a branch circuit of electrical panel meter system 100 that receives a same power phase (e.g., A, B, or C), as described in more detail below.

At process block 510, method 500 may include comparing each received electrical reading to the measured parameter. This may be performed, e.g., by computer 330 of field tester 300. The comparison may include an acceptable margin of error between the received electrical reading and the parameter measured by reference power meter 332. For example, in some embodiments, an acceptable margin of error may range from 0.2% to 1%. If an electrical reading from a meter module 108 is within the acceptable margin of error when compared to the measured parameter as determined by computer 330, that meter module 108 may be deemed to pass the metering accuracy test.

At process block 512, method 500 may include indicating a pass/fail result for each of the at least some of the plurality of meter modules. In some embodiments, the pass/fail result for each of the at least some of the plurality of meter modules may be shown on, e.g., display 344 of computer 330. The pass/fail results may additionally or alternatively be downloaded from field tester 300 to a host computer or other computer device, printed at a printer coupled to field tester 300, and/or otherwise provided to a user in any suitable manner.

In some embodiments, process blocks 504, 508, 510, and 512 may be repeated for each group of meter modules 108 that may be coupled to respective branch circuits receiving the same power phase. For example, process blocks 504, 508, 510, and 512 may be performed for meter modules 108 that monitor power phase A branch circuits, for meter modules 108 that monitor power phase B branch circuits, and again for meter modules 108 that monitor power phase C branch circuits. In each case, process block 504 may synchronize the injected electrical signal to the particular power phase voltage. In some embodiments, the testing of meter modules 108 for each power phase may require a total of 20-60 seconds for an electrical panel meter system having 40-50 meter modules 108.

In some embodiments, upon completion of method 500, computer 330 may issue a test complete command to controller 112, which may respond by returning electrical panel meter system 100 to a normal mode of operation. In some embodiments, test mode electrical readings stored in system memory 110 may be deleted.

In some embodiments, a non-transitory computer-readable medium, such as, e.g., a removable storage disk or device, may include computer instructions capable of being executed by processor 340 of field tester 300 and/or of performing process blocks 504, 506, 508, 510, and 512 of method 500.

Persons skilled in the art should readily appreciate that the invention described herein is susceptible of broad utility and application. Many embodiments and adaptations of the invention other than those described herein, as well as many variations, modifications, and equivalent arrangements, will be apparent from or reasonably suggested by the invention and the foregoing description thereof, without departing from the substance or scope of the invention. For example, although described in connection with field testing meter modules in an electrical panel meter system, the apparatus and methods described herein may have application in other electrical metering or measurement applications where field testing of multiple measurement devices mounted in an enclosure and having an independent test conductor coupled to one or more of the measurement devices is desired. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems, or methods disclosed, but, to the contrary, the intention is to cover all modifications, equivalents, and alternatives falling within the scope of the invention, as defined by the following claims.

What is claimed is:

1. A field tester for testing metering accuracy, the field tester comprising:
   a reference power meter;
   a current source having an output coupled to an input of the reference power meter;
   a computer coupled to the reference power meter and to the current source, the computer comprising a processor and a memory;
   a plurality of power conductors coupled to the reference power meter and to the current source and configured to be coupled to a respective plurality of terminals of a main line connector of an electrical panel meter system;
   a first conductor coupled to an output of the reference power meter and configured to be coupled to a first terminal of a test conductor of the electrical panel meter system, the test conductor coupled sequentially to each meter module of a plurality of meter modules of the electrical panel system;
   a second conductor coupled to a return of the current source and configured to be coupled to a second terminal of the test conductor; and
   a third conductor coupled to the computer and configured to be coupled to a controller of the electrical panel meter system,
   wherein the controller includes an Ethernet connector coupled to the third conductor to provide Ethernet communications between the controller and the computer,
   wherein the controller is configured to communicate with a system memory and the each meter module of the electrical panel system, and
   wherein the controller to provide energy monitoring, meter module testing, related data calculation and analysis functions and perform various calculations and/or determinations related to electrical readings received from the each meter module of the electrical panel system.

2. The field tester of claim 1, wherein the plurality of power conductors comprises an A phase conductor, a B phase conductor, a C phase conductor, and a neutral conductor.

3. The field tester of claim 1, wherein the reference power meter has an accuracy rating of 0.02% or better.

4. The field tester of claim 1, wherein the current source is configured to receive line-to-line voltage of up to about 480 volts AC and generate up to about 20 amps AC current for 20 to 60 seconds.

5. The field tester of claim 1, wherein the computer is a laptop computer.

6. The field tester of claim 1, wherein the computer is configured to:
   issue a test mode command to the controller;
   command the current source to output an electrical signal via the first conductor; and
   command the reference power meter to measure a parameter related to the electrical signal.

7. The field tester of claim 6, wherein the parameter comprises an energy value.

8. The field tester of claim 1, wherein the computer is configured to:
   issue a send command to the controller to have at least some of the plurality of meter modules sample electrical readings of an electrical signal passing through the test conductor and send the sampled electrical readings back to the computer;
   receive the sampled electrical readings;
   compare the received electrical readings to a parameter of the electrical signal measured by the reference power meter; and
   indicate a pass/fail result for each of the at least some of the plurality of meter modules.

9. An electrical panel meter system configured to be field tested for metering accuracy, the electrical panel meter system comprising:
   a plurality of branch circuit connectors, each one of the plurality of branch circuit connectors configured to be coupled to a respective branch circuit to provide electrical power thereto;
   a plurality of current sensors, each one of the plurality of current sensors coupled to a respective one of the plurality of branch circuit connectors;

a plurality of meter modules, each one of the plurality of meter modules coupled to a respective one of the plurality of current sensors;

a controller coupled to the plurality of meter modules;

a test conductor coupled sequentially to each one of the plurality of current sensors, the test conductor having no electrical connection to the plurality of branch circuit connectors;

a first terminal coupled to one end of the test conductor; and a second terminal coupled to a second opposite end of the test conductor, wherein a conductor is to be coupled to a computer and configured to be coupled to the controller, wherein the controller includes an Ethernet connector coupled to the conductor to provide Ethernet communications between the controller and the computer, wherein the controller is configured to communicate with a system memory and the plurality of meter modules, and wherein the controller to provide energy monitoring, meter module testing, related data calculation and analysis functions and perform various calculations and/or determinations related to electrical readings received from the plurality of meter modules.

10. The electrical panel meter system of claim 9, wherein the plurality of current sensors comprise solid core or split core current transformers.

11. The electrical panel meter system of claim 9, wherein each one of the plurality of meter modules comprises a meter module processor and a meter module memory and is configured to:

sample an electrical reading in response to receiving a read command from the controller; and transfer a sampled electrical reading to the controller.

12. The electrical panel meter system of claim 9, wherein the controller is configured to:

receive a test mode command from a field tester;

issue a read command to at least some of the plurality of meter modules in response to receiving a send command from the field tester;

receive electrical readings from the at least some of the plurality of meter modules in response to issuing the read command; and send the received electrical readings to the field tester.

13. A method of field testing an electrical panel meter system for metering accuracy, the method comprising:

coupling a plurality of conductors from a field tester to the electrical panel meter system;

injecting an electrical signal from the field tester into the electrical panel meter system;

measuring at the field tester a parameter of the electrical signal;

receiving an electrical reading from each of at least some of a plurality of meter modules of the electrical panel meter system;

comparing each received electrical reading to the measured parameter; and indicating a pass/fail result for each of the at least some of the plurality of meter modules, wherein a conductor is to be coupled to a computer and configured to be coupled to a controller, wherein the controller includes an Ethernet connector coupled to the conductor to provide Ethernet communications between the controller and the computer, wherein the controller is configured to communicate with a system memory and the plurality of meter modules, and wherein the controller to provide energy monitoring, meter module testing, related data calculation and analysis functions and perform various calculations and/or determinations related to electrical readings received from the plurality of meter modules.

14. The method of claim 13 wherein the measured parameter comprises an energy value.

15. The method of claim 13 wherein the coupling of the plurality of conductors comprises coupling first and second conductors from the field tester to first and second terminals, respectively, of a test conductor coupled sequentially to a plurality of current sensors of the electrical panel meter system, each one of the plurality of current sensors coupled to a respective one of the plurality of meter modules.

16. The method of claim 15 wherein the injecting of the electrical signal from the field tester into the electrical panel meter system comprises injecting the electrical signal into the first terminal via the first conductor.

17. The method of claim 13 wherein the coupling of the plurality of conductors comprises:

coupling a plurality of power conductors from the field tester to a respective plurality of terminals of a main line connector of the electrical panel meter system; and coupling a third conductor from the field tester to the controller of the electrical panel meter system.

18. The method of claim 13 wherein the injecting of the electrical signal from the field tester into the electrical panel meter system comprises synchronizing the electrical signal to a first power phase-to-neutral voltage.

19. The method of claim 13 wherein the receiving of the electrical reading from each of the at least some of the plurality of meter modules of the electrical panel meter system comprises receiving the electrical reading from each of the plurality of meter modules coupled to a first power phase.

20. The method of claim 13 further comprising:

issuing a test mode command from the field tester to the electrical panel meter system after the coupling of the plurality of conductors and before the injecting of the electrical signal; and issuing a send command from the field tester to the electrical panel meter system before the receiving the electrical reading from each of the least some of the plurality of meter modules.

* * * * *